United States Patent
Merchant et al.

(10) Patent No.: US 6,471,925 B1
(45) Date of Patent: Oct. 29, 2002

(54) METHOD FOR TREATING AN EFFLUENT GAS DURING SEMICONDUCTOR PROCESSING

(75) Inventors: Sailesh Mansinh Merchant; Sudhanshu Misra; Pradip Kumar Roy, all of Orlando, FL (US)

(73) Assignee: Agere Systems Guardian Corp., Orlando, FL (US)

(*) Notice: Subject to any disclaimer, the term of this patent is extended or adjusted under 35 U.S.C. 154(b) by 0 days.

(21) Appl. No.: 09/488,899

(22) Filed: Jan. 21, 2000

(51) Int. Cl.[7] .......................... B01D 53/62; B01D 53/66
(52) U.S. Cl. ........................ 423/219; 423/247
(58) Field of Search ................ 423/210, 247, 423/219; 502/525

(56) References Cited

U.S. PATENT DOCUMENTS

| | | | |
|---|---|---|---|
| 4,735,633 A | 4/1988 | Chiu .................. | 55/2 |
| 5,149,516 A | 9/1992 | Han et al. .............. | 423/415 A |
| 5,723,838 A | 3/1998 | Shin et al. .............. | 204/157.3 |
| 5,882,616 A | 3/1999 | Ziebarth et al. ......... | 423/245.3 |
| 5,955,037 A | 9/1999 | Holst .................. | 422/171 |

FOREIGN PATENT DOCUMENTS

| | | | | |
|---|---|---|---|---|
| JP | 50-37674 | * | 4/1975 | .................. 423/247 |
| JP | 1-270928 A | * | 10/1989 | .................. 502/525 |
| JP | 1-317540 A | * | 12/1989 | .................. 423/247 |
| JP | 2-144125 A | * | 6/1990 | .................. 423/247 |

OTHER PUBLICATIONS

Catalono et al., "Take this Gas and Scrub it: Bearing a Date Dec. 27, 1999". Vacuum Abatement—The Integration Generation:, Future Fab Issue 5—Process Gases Chemicals & Materials, pp. 1–9.

McNabb et al., "Optimization of $C_2F_6$ Burnbox Destruction", Semiconductor International, Apr. 1998, pp. 1–6.

* cited by examiner

Primary Examiner—Wayne A. Langel
Assistant Examiner—Timothy C. Vanoy
(74) Attorney, Agent, or Firm—John L. DeAngelis, Jr.; Beusse, Brownlee, Bowdoin & Wolter, P.A.

(57) ABSTRACT

A method for treating an effluent gas from a semiconductor processing system includes the steps of exhausting the effluent gas from a processing chamber, and catalytically treating the effluent gas with the at least one mixed metal oxide. The effluent gas includes unconsumed process gasses introduced during semiconductor processing operations, such as during chemical vapor deposition (CVD) and plasma-reactive ion etching. The mixed metal oxide may include a hetero bi-metal oxide, a hetero tri-metal oxide, or a perovskite. A hetero bi-metal oxide includes $LaCoO_3$ and $LaMnO_3$, for example, and a hetero tri-metal oxide includes $(La_xPr_{1-x})CoO_3$ and $(La_xPr_{1-x})MnO_3$, for example. The effluent gas may include at least carbon monoxide and/or ozone. Thus, catalytically treating the effluent gas preferably includes the catalytically converting carbon monoxide to carbon dioxide and/or ozone to oxygen. With the effluent gas being treated by the catalytic converter prior to being released into the atmosphere, undesirable gases, such as carbon monoxide and unreacted ozone are efficiently converted into non-harmful carbon dioxide and oxygen.

26 Claims, 3 Drawing Sheets

METHOD FOR TREATING AN EFFLUENT GAS DURING SEMICONDUCTOR PROCESSING

FIELD OF THE INVENTION

The present invention relates to the field of semiconductor processing, and, more particularly, to a system and associated method for treating an effluent gas from a semiconductor processing chamber.

BACKGROUND OF THE INVENTION

Semiconductor processing operations typically include a chemical vapor deposition (CVD) step for depositing dielectric layers on a semiconductor wafer. The CVD process is performed in a semiconductor processing chamber. A dielectric layer typically includes silicon dioxide, which may be undoped or doped. A common approach for depositing silicon dioxide is to use a tetraethyl orthosilicate (TEOS) reagent. The TEOS reagent may also be subjected to ozone during the CVD process. As a result, the effluent gas released from the semiconductor processing chamber includes unconsumed process gases, as well as by-products of such gases. In particular, the effluent gas contains processed carbon monoxide and unreacted ozone. It is undesirable to release either of these gases into the atmosphere.

As a result of the above described CVD process, silicon dioxide is also deposited on the walls of the semiconductor processing chamber. Consequently, the walls must be periodically cleaned. A reactive ion etching (RIE) cleaning process may be performed in the semiconductor processing chamber for this purpose. Typically, fluorocarbons are used in the RIE cleaning process to remove silicon dioxide from the chamber walls. The reaction between the fluorocarbons and the deposited silicon dioxide results in the formation of carbon monoxide. The effluent gas released from the semiconductor processing chamber during the RIE cleaning process thus contains carbon monoxide.

Additionally, many other semiconductor processes result in effluent gas being released from the semiconductor processing chamber and including other unconsumed process gases, as well as by-products of such gases. A variety of gas treatment approaches have been developed to treat an effluent gas being released from a semiconductor processing chamber. A common approach is to decompose, react, or combust the undesirable gases at high temperatures.

Scrubbing with water, chemical solutions, and dry chemicals have also been used to treat an effluent gas. Water scrubbing may be used to dissolve water soluble components of the effluent gas. For contaminants which are insoluble or sparingly soluble in water, chemical scrubbing can be used. Although effective, the water or chemical absorbent must be treated prior to release. With increasingly stringent controls on water pollution, such scrubbing techniques are becoming less attractive.

Yet another approach is dilution. That is, the concentrations of undesirable species are reduced by combining the waste effluent gas with large volumes of air or an inert diluent gas. While such reduction of concentration levels may literally satisfy existing effluent gas limits, they do not result in an actual reduction in the amount of undesirable species released into the atmosphere. Moreover, as pollution regulations are sure to be tightened, the use of dilution as a method for treating an effluent gas will become less acceptable.

Dry chemical adsorption and/or reaction may also be used to treat the effluent gas. For example, the use of activated carbon beds to physically adsorb gas constituents is well established. Activated carbon, while highly efficient, scavenges gas constituents by both physical and chemical adsorption. Physically adsorbed gas constituents can later desorb unless the carbon is periodically treated by carefully controlled oxidation.

An example of an effluent gas treatment system is disclosed in U.S. Pat. No. 5,955,037 to Hoist et al. and titled "Effluent Gas Stream Treatment System Having Utility For Oxidation Treatment Of Semiconductor Manufacturing Effluent Gas". In particular, the effluent gas stream treatment system includes a pre-oxidation treatment unit such as a scrubber, an oxidation unit such as an electrothermal oxidizer, and a post-oxidation treatment unit such as a wet or dry scrubber.

Another effluent gas treatment system is disclosed in U.S. Pat. No. 4,735,633 to Chiu and titled "Method and System For Vapor Extraction From Gases". Chiu discloses a plasma extraction reactor including a pair of parallel, spaced apart electrodes for removing vapor phase waste from an effluent gas. The vapor phase waste products are converted to a solid phase deposited directly on the electrodes which then may be discarded.

SUMMARY OF THE INVENTION

In view of the foregoing background, it is therefore an object of the present invention to provide a semiconductor processing system and associated method for efficiently treating an effluent gas to remove undesired gases contained therein prior to being released into the atmosphere.

This and other objects, features and advantages in accordance with the present invention are provided by a method for treating an effluent gas released from a semiconductor processing system including the steps of exhausting the effluent gas from a processing chamber, and catalytically treating the effluent gas with the at least one mixed metal oxide. The effluent gas may be produced as a result of a chemical vapor deposition (CVD) process such as TEOS-ozone and/or from a RIE process using fluorocarbons, for example.

The effluent gas may comprise at least carbon monoxide and/or ozone. Accordingly, catalytically treating the effluent gas preferably comprises catalytically converting carbon monoxide to carbon dioxide and/or ozone to oxygen. Also, the step of catalytically treating the effluent gas may include providing at least one catalyst body having t least outer surface portions comprising the at east one mixed metal oxide, and contacting the at east one catalyst body with the effluent gas.

Objects, features and advantages in accordance with the present invention are also provided by a semiconductor processing system comprising a processing chamber having an exhaust outlet for an effluent gas, and a catalytic converter connected in fluid communication with the exhaust outlet. The catalytic converter preferably comprises at least one mixed metal oxide for catalytically treating the effluent gas. The effluent gas is treated by the catalytic converter prior to being released into the atmosphere, therefore, undesired gases, such as processed carbon monoxide and unreacted ozone resulting from semiconductor processing operations are efficiently converted into carbon dioxide and oxygen.

In one embodiment of the invention, the processing chamber comprises a chemical vapor deposition (CVD) reactor. The CVD reactor preferably comprises a TEOS source introducing TEOS reagent into the CVD reactor, and thereby causing the effluent gas to include carbon monoxide. The catalytic converter preferably catalytically converts carbon monoxide to carbon dioxide. Similarly, if ozone is introduced into the effluent gas during the CVD process, then the converter catalytically converts the ozone into oxygen. Carbon dioxide and oxygen are more environmentally desirable to release into the atmosphere. The CVD process preferably deposits a dielectric layer, such as silicon dioxide, on a semiconductor wafer. The CVD process is performed using either a thermal or plasma energy source, and preferably with a high deposition rate at low pressure.

In another embodiment of the invention, the semiconductor processing chamber comprises a plasma source for introducing plasma into the chamber for cleaning the walls. The walls are cleaned to remove dielectric material, such as silicon dioxide, deposited during the CVD process. A reactive ion etching (RIE) or plasma etching process is preferably performed for removing the silicon dioxide from the chamber walls.

Typically, fluorocarbons are used in the RIE cleaning process to remove the silicon dioxide from the chamber walls. The reaction between the fluorocarbons and the deposited silicon dioxide results in the formation of carbon monoxide. The effluent gas released from the semiconductor processing chamber during the RIE cleaning process thus contains carbon monoxide. The catalytic converter preferably catalytically converts the carbon monoxide in the effluent gas to carbon dioxide.

The at least one mixed metal oxide in the catalytic converter preferably comprises at least one hetero bi-metal oxide and/or at least one hetero tri-metal oxide. In other words, the at least one metal comprises a perovskite phase metal oxide. Hetero bi- and tri-metal oxides are catalysts for oxidation of carbon monoxide generated during the CVD process using a TEOS reagent, and during the RIE or plasma etching process for removing the silicon dioxide from the chamber walls. Likewise, the hetero bi- and tri-metal oxides are catalysts for unreacted ozone generated during the CVD process Another aspect of the present invention relates to a catalytic converter for a semiconductor processing system for treating an effluent gas released during a semiconductor processing operation. The semiconductor processing operation preferably includes a CVD process for depositing silicon dioxide on a semiconductor wafer, and a RIE cleaning process for cleaning chamber walls of the semiconductor processing system as a result of the silicon dioxide being deposited thereon during the CVD process.

The catalytic converter preferably comprises a housing having an inlet for receiving the effluent, and an outlet for releasing the effluent gas. The catalytic converter preferably comprises at least one mixed metal oxide for catalytically treating the effluent gas. The catalytic converter also preferably comprises at least one catalyst body carried by the housing, wherein the at least one mixed metal oxide is preferably coated thereon. The at least one catalyst body preferably comprises at a plurality of mesh distribution plates, a plurality of beads, or a cylindrical tube.

DETAILED DESCRIPTION OF THE PREFERRED EMBODIMENTS

The present invention will now be described more fully hereinafter with reference to the accompanying drawings, in which preferred embodiments of the invention are shown. This invention may, however, be embodied in many different forms and should not be construed as limited to the embodiments set forth herein. Rather, these embodiments are provided so that this disclosure will be thorough and complete, and will fully convey the scope of the invention to those skilled in the art. Like numbers refer to like elements throughout.

Figure 1:
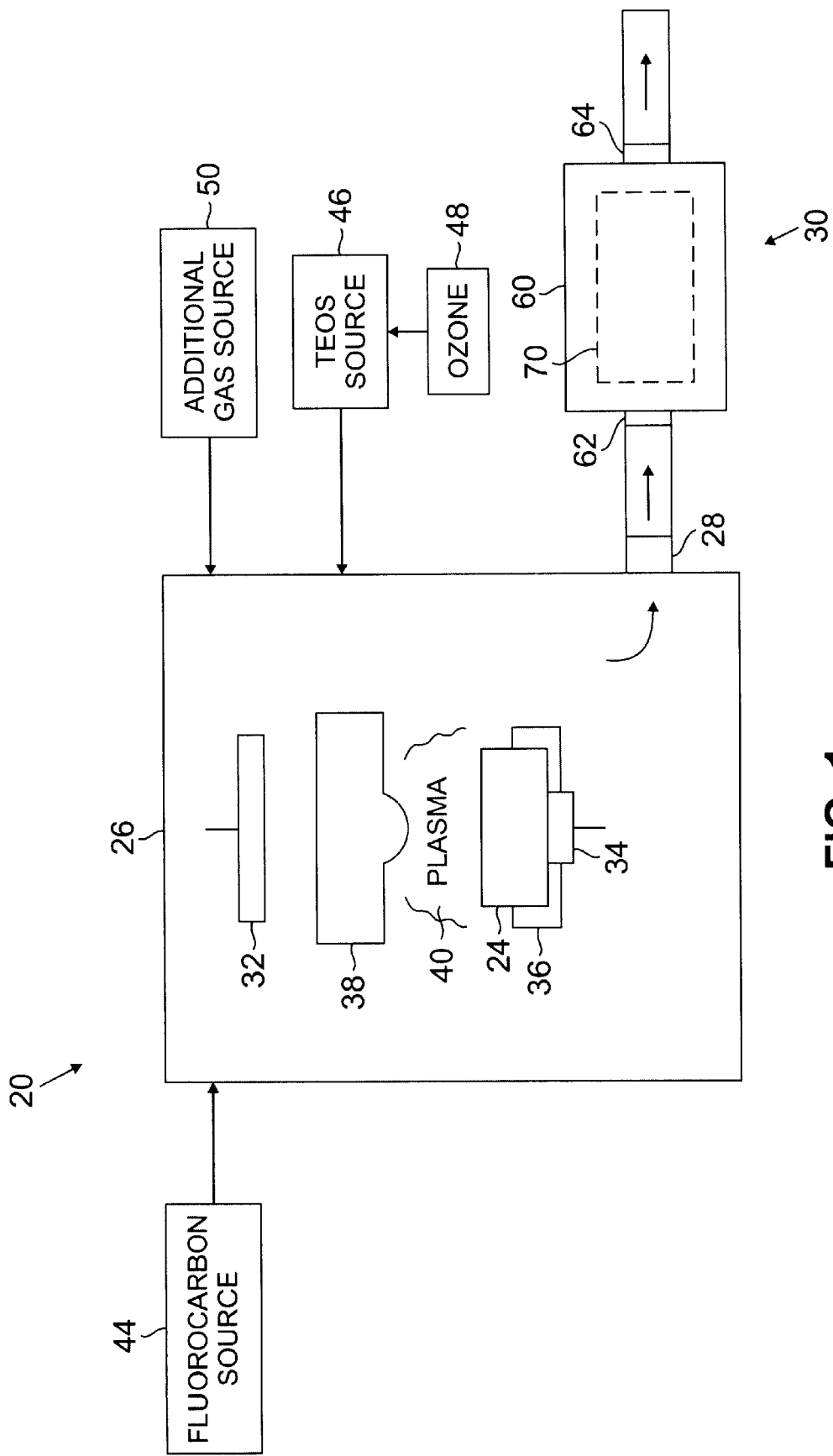
FIG. 1 is a schematic diagram of a semiconductor wafer processing system including a catalytic converter in accordance with the present invention.

A semiconductor processing system 20 and associated method for treating an effluent gas released therefrom will be described with reference to FIGS. 1–3 in accordance with the present invention. A semiconductor wafer 24 may be processed via the semiconductor processing system, 20. As will be explained in greater below, the process-performed on the semiconductor wafer 24 may be a chemical vapor deposition (CVD) process for depositing a dielectric layer thereon. The dielectric layer preferably includes silicon dioxide, which may be doped or undoped.

The semiconductor processing system 20 comprises a processing chamber 26 having an exhaust outlet 28 for releasing an effluent gas 22, and a catalytic converter 30 connected in fluid communication with the exhaust outlet. The catalytic converter 30 comprises at least one mixed metal oxide for catalytically treating the effluent gas 22. The effluent gas 22 is treated by the catalytic converter 30 prior to being released into the atmosphere, therefore, undesirable gases, such as carbon monoxide and unreacted ozone are efficiently converted into carbon dioxide and oxygen.

The processing chamber 26 preferably comprises a chemical vapor deposition (CVD) reactor, which may include a thermal or plasma energy source as will be readily appreciated by one skilled in the art. For purposes of illustrating the present invention, a plasma enhanced CVD reactor is illustrated in FIG. 1. The CVD process is performed with a high deposition rate at low pressure. For example, the deposition rate is in a range of about 1 to 2.5 nm/s, and the pressure is in a range of about 1–10 mtorr. The CVD deposition temperature is in a range of about 275 to 450 degrees C., with a typical temperature range of about 350 to 420 degrees C.

The plasma enhanced CVD reactor includes top and bottom electrodes 32 and 34, a focus ring holder 36, and a dispersion head 38 for dispersing the plasma 40 across the upper surface of the semiconductor wafer 24. The semiconductor wafer 24 is loaded into the processing chamber 26 and placed in the focus ring holder 36. The pressure inside the chamber 26 is reduced by a vacuum system.

After the vacuum is established, the processing chamber 26 is filled with a reactive gas. The reactive gas preferably includes tetraethyl orthosilicate (TEOS) mixed with ozone. A TEOS reagent in liquid form is carried by a source or container 46, and ozone from an ozone source 48 is bubbled into the liquid TEOS producing the reactive gas as will be readily understood by one skilled in the art. An additional gas source 50 provides a gas, such as an additional flow of ozone, into the processing chamber 26 to cooperate with the reactive gas.

A power supply creates a radio frequency (RF) field through the top and bottom electrodes 32, 34. The RF power is in a range of about 100 to 500 watts, with a typical range of about 200 to 300 watts. The RF field energizes the reactive gas including the ozone 50 to a plasma state. In the energized state, silicon dioxide is deposited on the surface of the semiconductor wafer 24. The effluent gas 22 is discharged from the processing chamber 26 via the exhaust outlet 28.

Figure 3:
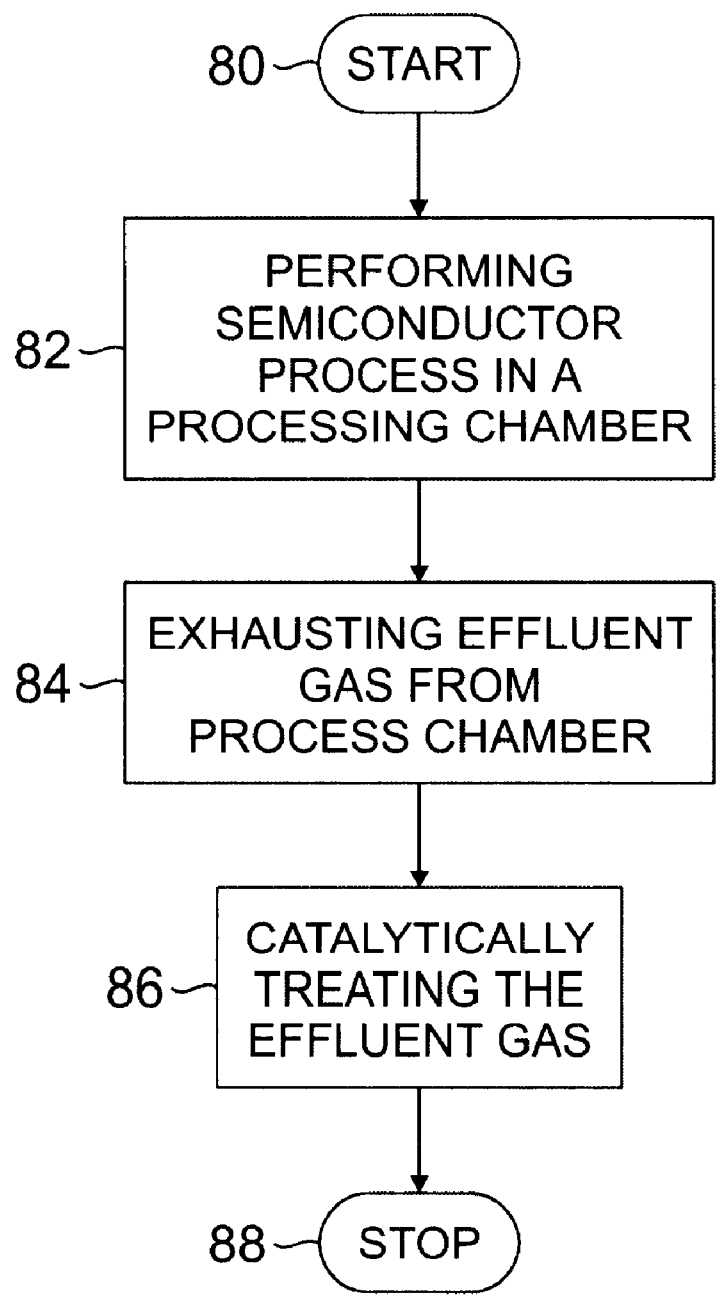
FIG. 3 is a flowchart illustrating a method for treating an effluent gas in accordance with the present invention.

Referring now to FIG. 3, the method of the resent invention includes, from the start (Block 80), processing the semiconductor wafer in a processing chamber 26 at Block 82. The effluent gas is exhausted from the processing chamber 26 generated during processing of the semiconductor wafer 24 at Block 84. The effluent gas is then catalytically treated using the catalytic converter 30, comprising at least one mixed metal oxide, connected in fluid communication with the exhaust outlet 28 at Block 86 before ending the method at Block 88 and releasing the treated gas.

As a result of the CVD process, the released effluent gas 22 includes unconsumed process gases, as well as by-products of such gases. In particular, for example, the effluent gas 22 may contain carbon monoxide and unreacted ozone. Processed carbon monoxide and unreacted ozone are thus efficiently converted into carbon dioxide and dioxide by the catalytic converter 30.

The at least one mixed metal oxide in the catalytic converter 30 comprises at least one hetero bi-metal oxide and/or at least one hetero tri-metal oxide. In other words, the at least one metal comprises a perovskite phase metal oxide. Hetero bi- and tri-metal oxides are catalysts for oxidation of carbon monoxide generated during the CVD process using a TEOS reagent, and during the RIE or plasma etching process for removing the silicon dioxide from the chamber walls. Likewise, the hetero bi- and tri-metal oxides are catalysts for unreacted ozone released during the CVD process.

The at least one mixed metal oxide may comprise at least one hetero bi-metal oxide, which includes $LaCoO_3$, $LaMnO_3$, $PrCoO_3$ and $NdCoO_3$, for example. Likewise, the at least one mixed metal oxide may comprise at least one hetero tri-metal oxide, which includes $(La_xPr_{1-x})CoO_3$ and $(La_xPr_{1-x})MnO_3$, for example. These catalysts are partially consumed and regenerated in a continuous cycle. Homomolecular exchange of dioxide on the hetero bi- and tri-metal oxides results in a continuous cycle of catalyst consumption and regeneration during this catalytic process. This mechanism is called reagent or intrafacial catalysis, as will be readily understood by one skilled in the art.

As discussed above, walls of the chamber 26 need to be periodically cleaned as a result of silicon dioxide being deposited thereon during the CVD process. A reactive ion etching (RIE) or plasma etching process is performed for removing the silicon dioxide from the chamber 26 walls.

Typically, fluorocarbons are provided by a fluorocarbon source 44 and are used in the RIE cleaning process to remove the deposited silicon dioxide. The reaction between the fluorocarbons and the deposited silicon dioxide results in the formation of carbon monoxide. The effluent gas 22 released from the semiconductor processing chamber 26 during the RIE cleaning process thus contains carbon monoxide. The catalytic converter 30 catalytically converts the carbon monoxide in the effluent gas to carbon dioxide.

The catalytic converter 30 for a semiconductor processing system 20 for treating an effluent gas 22 released during a semiconductor processing operation will now be described in more detail. As previously discussed, the semiconductor processing operation includes a CVD process for depositing silicon dioxide on a semiconductor wafer 24, and a RIE cleaning process for cleaning chamber 26 walls of the semiconductor processing system 20 as a result of the silicon dioxide being deposited thereon during the CVD process.

The catalytic converter 30 comprises a housing 60 having an inlet 62 for receiving the effluent gas 22, and an outlet 64 for releasing treated effluent gas. The catalytic converter includes at least one mixed metal oxide for catalytically treating the effluent gas. The catalytic converter includes at least one catalyst body 70 carried by the housing 60. An outer surface of the catalyst body 70 includes the mixed metal oxide. If the catalyst body 70 is hollow, the inner surface may also be coated with the mixed metal oxide.

Figure 2A:
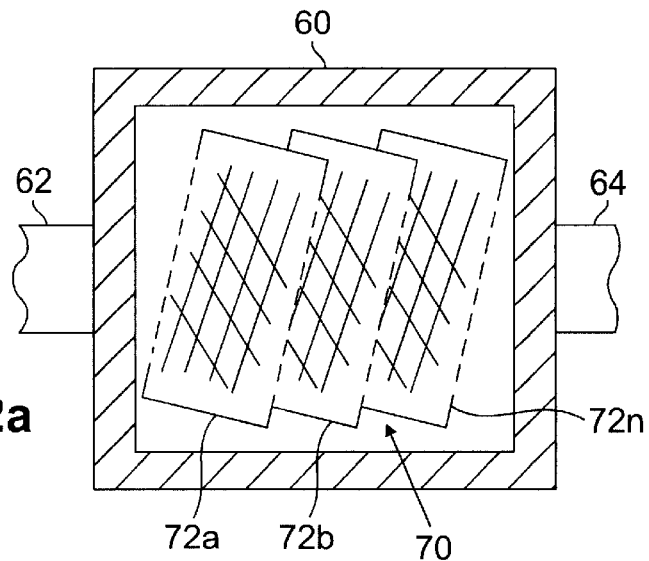
FIGS. 2a–2c are schematic diagrams illustrating different embodiments of the catalyst body carried by the catalytic converter illustrated in FIG. 1.
Figure 2B:
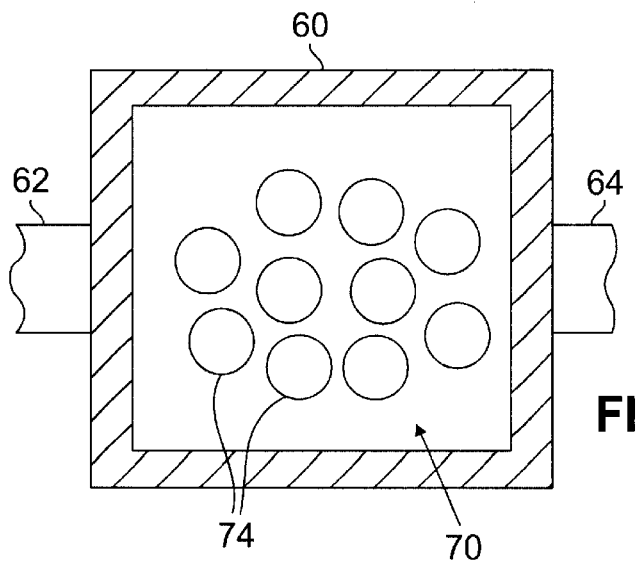
Figure 2C:
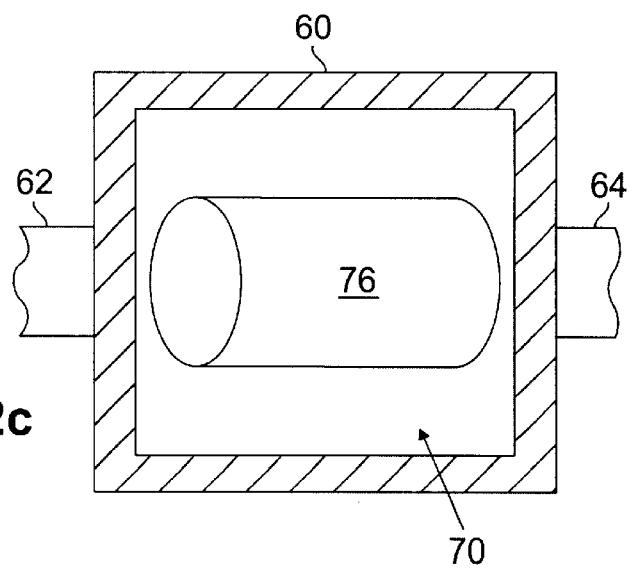

The catalyst body 70 may be formed in a variety of shapes and sizes as would be readily appreciated by the skilled artisan. For example, the catalyst body 70 may include a plurality of mesh distribution plates 72a–72n, a plurality of beads 74, or a cylindrical tube 76, as shown in FIGS. 2a–2c. Of course other shapes and sizes of the catalyst body 70 which treat the effluent gas 22 in accordance with the present invention are acceptable. The larger the surface area of the catalyst body 70, the greater the efficiency for treating the effluent gas 22 released from the processing chamber 26. The catalyst body may also be formed of ceramic.

Many modifications and other embodiments of the invention will come to the mind of one skilled in the art having the benefit of the teachings presented in the foregoing descriptions and the associated drawings. Therefore, it is understood that the invention is not to be limited to the specific embodiments disclosed, and that modifications and embodiments are intended to be included within the scope of the appended claims.

That which is claimed is:

1. A method for treating an effluent gas from a semiconductor processing system comprising the steps of:

introducing a reactive gas comprising ozone in a processing chamber during semiconductor processing operations and thereby causing the effluent gas to include ozone;

exhausting the effluent gas from the processing chamber;

providing a catalytic converter comprising a housing having an inlet for receiving the effluent gas and an outlet for releasing the effluent gas, and at least one catalyst body within the housing and having at least outer surface portions comprising at least one mixed metal oxide; and contacting the at least one catalyst body with the effluent gas for catalytically converting the ozone to oxygen.

2. A method according to claim 1 wherein the effluent gas is produced as a result of a chemical vapor deposition (CVD) process during the semiconductor processing operations.

3. A method according to claim 2 wherein the CVD process introduces a tetraethyl orthosilicate (TEOS) reagent into the processing chamber thereby causing the effluent gas to include carbon monoxide; and wherein catalytically treating the effluent gas comprises catalytically converting the carbon monoxide to carbon dioxide.

4. A method according to claim 1 wherein the at least one mixed metal oxide comprises at least one hetero bi-metal oxide.

5. A method according to claim 4 wherein the at least one hetero bi-metal oxide is selected from the group consisting of $LaCoO_3$, $LaMnO_3$, $PrCoO_3$ and $NdCoO_3$.

6. A method according to claim 1 wherein the at least one mixed metal oxide comprises at least one hetero tri-metal oxide.

7. A method according to claim 1 wherein the effluent gas further comprises carbon monoxide; and wherein catalytically treating the effluent gas comprises catalytically converting the carbon monoxide to carbon dioxide.

8. A method according to claim 1 wherein the effluent gas is produced as a result of a plasma etching process during the semiconductor processing operations thereby causing the effluent gas to include carbon monoxide; and wherein catalytically treating the effluent gas comprises catalytically converting the carbon monoxide to carbon dioxide.

9. A method according to claim 8 wherein the plasma etching process comprises a reactive ion etching (RIE) process using fluorocarbons.

10. A method according to claim 1 wherein the at least one catalyst body comprises ceramic.

11. A method according to claim 1 wherein the at least one catalyst body is selected from the group consisting of a plurality of mesh distribution plates, a plurality of beads, and a cylindrical tube.

12. A method for treating an effluent gas from a semiconductor processing system comprising the steps of:
   introducing a reactive gas comprising ozone in a processing chamber during a chemical vapor deposition process (CVD) and thereby causing the effluent gas to include ozone;
   exhausting the effluent gas from the processing chamber;
   providing a catalytic converter comprising a housing having an inlet for receiving the effluent gas and an outlet for releasing the effluent gas, and at least one catalyst body within the housing and having at least outer surface portions comprising at least one mixed metal perovskite; and
   contacting the at least one catalyst body with the effluent gas for catalytically converting the ozone to oxygen.

13. A method according to claim 12 wherein the CVD process introduces a tetraethyl orthosilicate (TEOS) reagent into the processing chamber thereby causing the effluent gas to include the ozone.

14. A method according to claim 12 wherein the at least one mixed metal perovskite is selected from the group consisting of a hetero bi-metal oxide and a hetero tri-metal oxide.

15. A method according to claim 14 wherein the hetero bi-metal oxide comprises at least one of $LaCoO_3$, $LaMnO_3$, $PrCoO_3$ and $NdCoO_3$.

16. A method according to claim 12 wherein the at least one catalyst body is selected from the group consisting of a plurality of mesh distribution plates, a plurality of beads, and a cylindrical tube.

17. A method for treating an effluent gas from a semiconductor processing system comprising the steps of:
   introducing plasma in a processing chamber during a reactive ion etching (RIE) process using fluorocarbons and thereby causing the effluent gas to include carbon monoxide;
   exhausting the effluent gas from the processing chamber;
   providing a catalytic converter comprising a housing having an inlet for receiving the effluent gas and an outlet for releasing the effluent gas, and at least one catalyst body within the housing and having at least outer surface portions comprising at least one mixed metal oxide; and
   contacting the at least one catalyst body with the effluent gas for catalytically converting the carbon monoxide to carbon dioxide.

18. A method according to claim 17 wherein the at least one mixed metal oxide is selected from the group consisting of a hetero bi-metal oxide and a hetero tri-metal oxide.

19. A method according to claim 18 wherein the hetero bi-metal oxide comprises at least one of $LaCoO_3$, $LaMnO_3$, $PrCoO_3$ and $NdCoO_3$.

20. A method according to claim 17 wherein the at least one mixed metal oxide comprises a mixed metal perovskite.

21. A method according to claim 17 wherein the at least one catalyst body is selected from the group consisting of a plurality of mesh distribution plates, a plurality of beads, and a cylindrical tube.

22. A method for treating an effluent gas from a semiconductor processing system comprising the steps of:
   introducing a reactive gas comprising tetraethyl orthosilicate (TEOS) reagent and ozone in a processing chamber during a chemical vapor deposition (CVD) process and thereby causing the effluent gas to include carbon monoxide and ozone;
   exhausting the effluent gas from the processing chamber;
   providing a catalytic converter comprising a housing having an inlet for receiving the effluent gas and an outlet for releasing the effluent gas, and at least one catalyst body within the housing and having at least outer surface portions comprising at least one mixed metal oxide; and
   contacting the at least one catalyst body with the effluent gas for catalytically converting the carbon monoxide to carbon dioxide and the ozone to oxygen.

23. A method according to claim 22 wherein the at least one mixed metal oxide is selected from the group consisting of a hetero bi-metal oxide and a hetero tri-metal oxide.

24. A method according to claim 23 wherein the hetero bi-metal oxide comprises at least one of $LaCoO_3$, $LaMnO_3$, $PrCoO_3$ and $NdCoO_3$.

25. A method according to claim 22 wherein the at least one mixed metal oxide comprises a mixed metal perovskite.

26. A method according to claim 22, wherein the at least one catalyst body is selected from the group consisting of plurality of mesh distribution plates, a plurality of beads, and a cylindrical tube.

* * * * *